(12) United States Patent
Tanaka et al.

(10) Patent No.: US 12,300,612 B2
(45) Date of Patent: May 13, 2025

(54) SEMICONDUCTOR STRUCTURE INCLUDING CONDUCTIVE LAYERS CONTACTING TRENCH

(71) Applicant: Winbond Electronics Corp., Taichung (TW)

(72) Inventors: Yoshinori Tanaka, Taichung (TW); Wei-Che Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 359 days.

(21) Appl. No.: 17/731,180

(22) Filed: Apr. 27, 2022

(65) Prior Publication Data

US 2023/0112433 A1    Apr. 13, 2023

(30) Foreign Application Priority Data

Oct. 12, 2021 (TW) .................... 110137664

(51) Int. Cl.
*H10B 12/00* (2023.01)
*G11C 5/06* (2006.01)
*H01L 23/528* (2006.01)
*H01L 23/532* (2006.01)
*H01L 29/40* (2006.01)
*H01L 29/423* (2006.01)

(52) U.S. Cl.
CPC ........ *H01L 23/53266* (2013.01); *G11C 5/063* (2013.01); *H01L 23/5283* (2013.01); *H01L 23/53271* (2013.01); *H01L 29/401* (2013.01); *H01L 29/4236* (2013.01); *H01L 29/42376* (2013.01); *H10B 12/053* (2023.02); *H10B 12/315* (2023.02); *H10B 12/34* (2023.02); *H10B 12/482* (2023.02); *H10B 12/485* (2023.02); *H10B 12/488* (2023.02)

(58) Field of Classification Search
CPC .... G11C 5/063; H10B 12/053; H10B 12/315; H10B 12/34; H10B 12/488; H01L 29/401
USPC .......................................... 257/330
See application file for complete search history.

(56) References Cited

U.S. PATENT DOCUMENTS

| 6,734,484 | B2 | 5/2004 | Wu |
| 2014/0061781 | A1 | 3/2014 | Kim |
| 2016/0172488 | A1* | 6/2016 | Oh ........................ H10B 12/315 257/330 |

FOREIGN PATENT DOCUMENTS

TW             557547 B    10/2003

* cited by examiner

*Primary Examiner* — Hoai V Pham
(74) *Attorney, Agent, or Firm* — Muncy, Geissler, Olds & Lowe, P.C.

(57) ABSTRACT

A semiconductor structure includes a substrate, a trench, a first conductive layer, a second conductive layer, a third conductive layer, a source region and a drain region, a bit line contact, and a storage node contact. The trench is disposed in the substrate. The first conductive layer is disposed in the trench. The second conductive layer is disposed on a top surface of the first conductive layer. The third conductive layer is disposed on the top surface of the first conductive layer and is electrically connected to the second conductive layer. The source region and the drain region are disposed in the substrate and disposed on opposite sides of the first conductive layer. The bit line contact is disposed on one of the source region and the drain region, and the storage node contact is disposed on the other of the source region and the drain region.

15 Claims, 16 Drawing Sheets

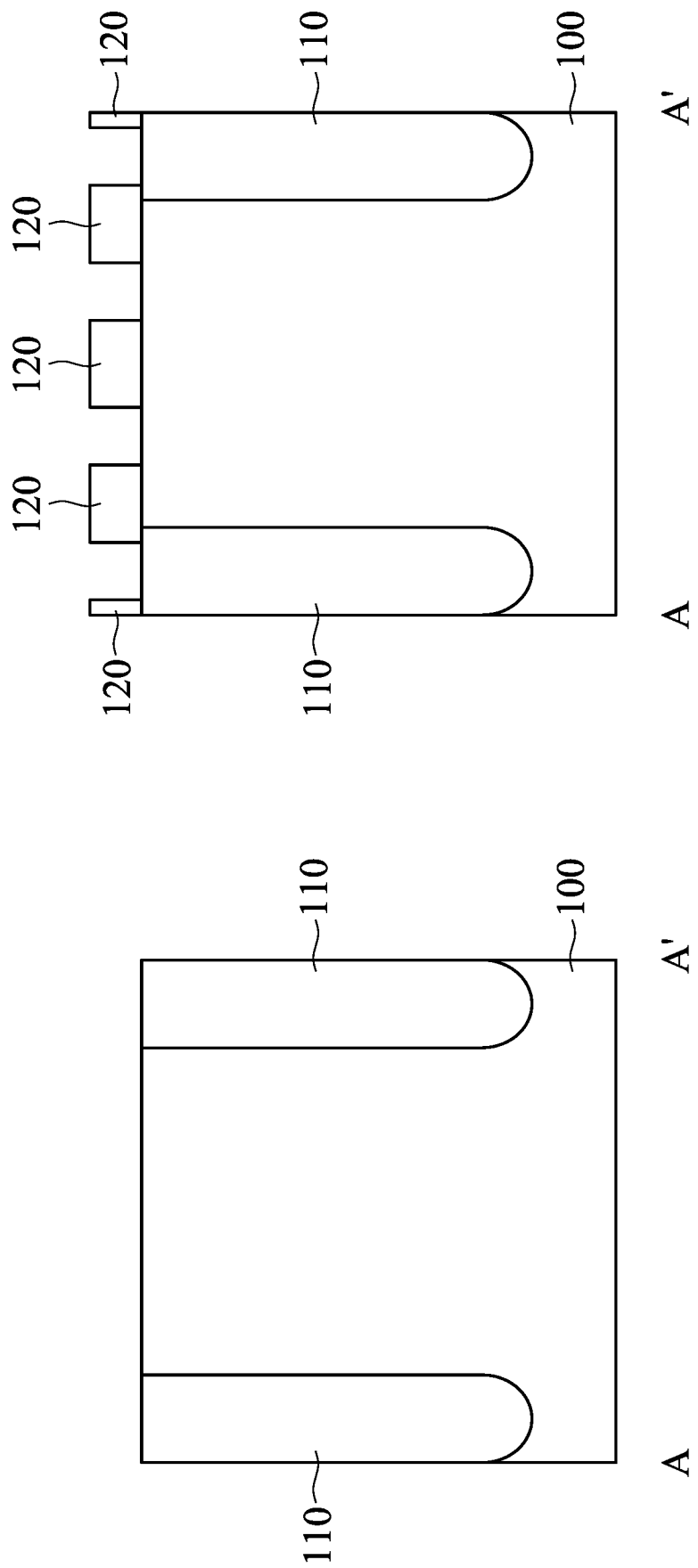

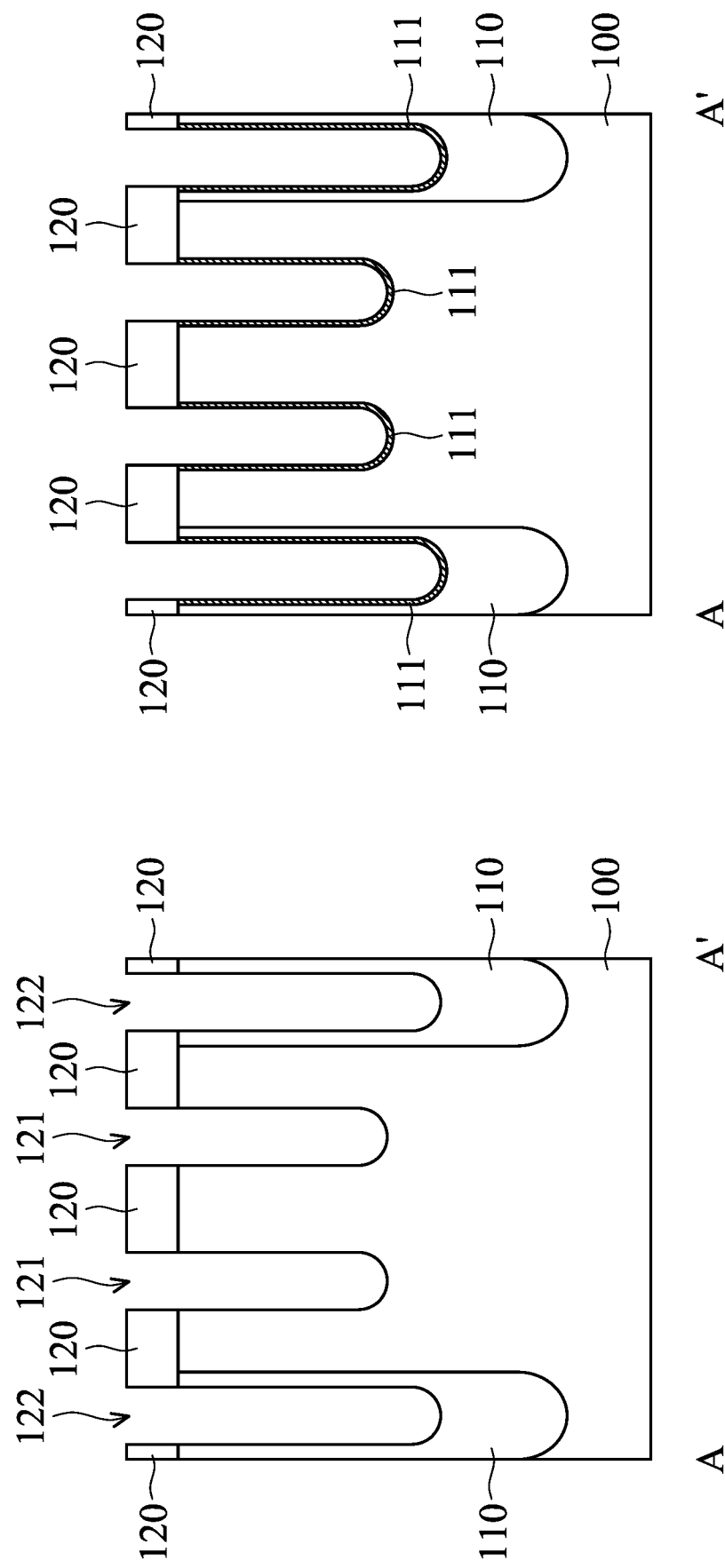

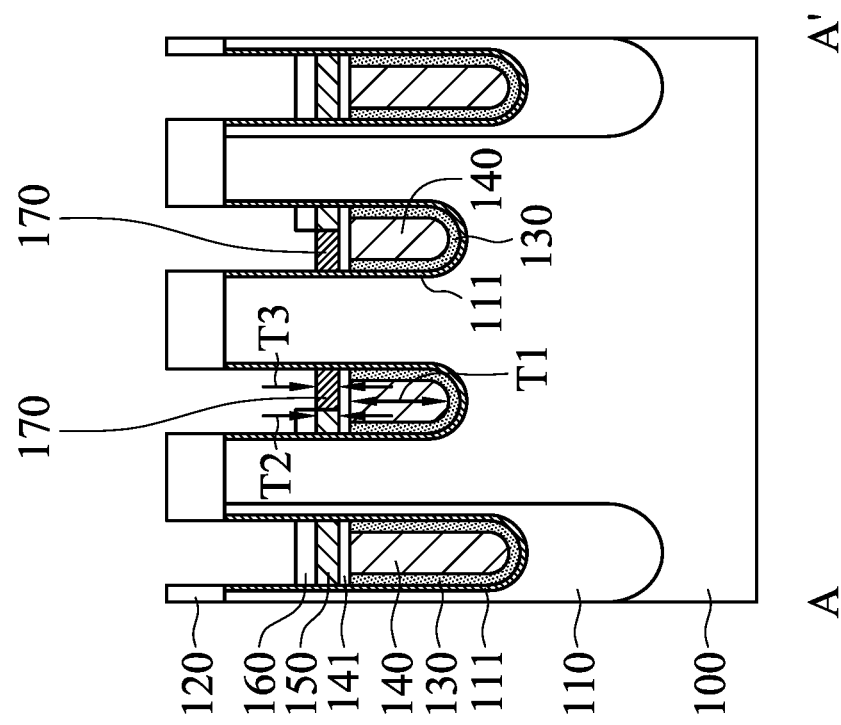
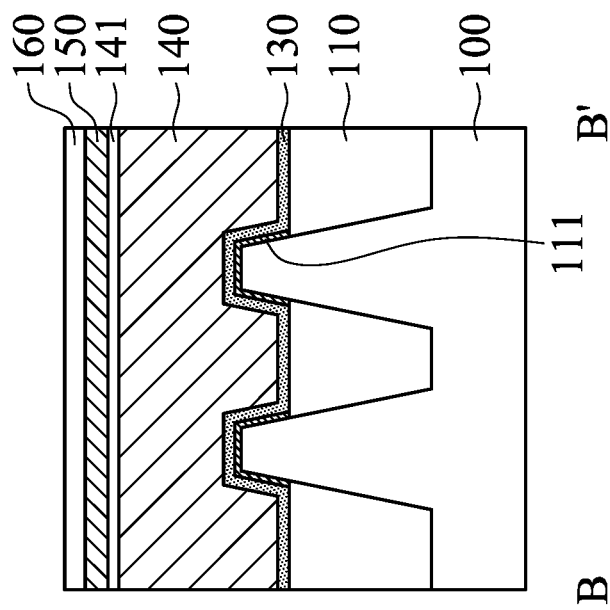
FIG. 16A
FIG. 16B

SEMICONDUCTOR STRUCTURE INCLUDING CONDUCTIVE LAYERS CONTACTING TRENCH

CROSS REFERENCE TO RELATED APPLICATIONS

This application claims priority of Taiwan Patent Application No. TW 110137664, filed on Oct. 12, 2021, the entirety of which is incorporated by reference herein.

BACKGROUND

Field of the Invention

Some embodiments of the present disclosure relate to a semiconductor structure and a method for forming the same, and, in particular, to a semiconductor structure with a word line structure including different work function materials, and a method for forming the same.

Description of the Related Art

With the trend of miniaturization of semiconductor devices, the size of memory units continues to shrink, and a buried word line memory device has been developed to increase integration and improve performance. However, the continuously shrinking size increases the capacitive coupling between neighboring elements or between components of the interconnection structure and/or causes a leakage current, which has a deterioration of the performance of the memory. Therefore, it is necessary to seek a solution for the problem of the adverse effects of the structure and formation method of the memory device.

SUMMARY

In view of the above problems, the present disclosure adjusts the relative positions of materials with different work functions in the semiconductor structure by disposing different work function materials of the word line structure and adjusting the positions of the different work function materials in the word line structure, thereby improving the electrical properties of the semiconductor structure. For example, a material with a low work function is provided at a position where leakage current needs to be avoided, and a material with a high work function is provided at a position where the on-state current needs to be increased, so as to avoid leakage current and increase the on-state current at the same time.

The semiconductor structure includes a substrate, a trench, a first conductive layer, a second conductive layer, a third conductive layer, a source region and a drain region, a bit line contact, and a storage node contact. The trench is disposed in the substrate. The first conductive layer is disposed in the trench. The second conductive layer is disposed on a top surface of the first conductive layer. The third conductive layer is disposed on the top surface of the first conductive layer and electrically connected to the second conductive layer. The source region and the drain region are disposed in the substrate and are disposed on opposite sides of the first conductive layer, respectively. The bit line contact is disposed on one of the source region and the drain region. The storage node contact is disposed on the other of the source region and the drain region.

The method for forming the semiconductor structure includes forming a trench in a substrate. A first conductive layer is formed in the trench. A second conductive layer is formed on the first conductive layer. A sacrificial layer is formed on the second conductive layer. The sacrificial layer is partially removed. The second conductive layer is etched with the remaining portion of the sacrificial layer as an etching mask to expose a portion of the second conductive layer. A third conductive layer is formed on the second conductive layer, wherein the third conductive layer covers the exposed portion of the second conductive layer.

BRIEF DESCRIPTION OF THE DRAWINGS

FIGS. 2-8, 9A, 9B, 10A, 10B, 11A, 11B, 12A, 12B, 13A, 13B, 14A, 14B, 15A, 15B, 16A, 16B, 17A, 17B, and 18 are schematic cross-sectional views of a semiconductor structure at various stages of formation, according to some embodiments of the present disclosure.

FIG. 19 is schematic cross-sectional view of a semiconductor structure according to another embodiment of the present disclosure.

DETAILED DESCRIPTION

Figure 1:
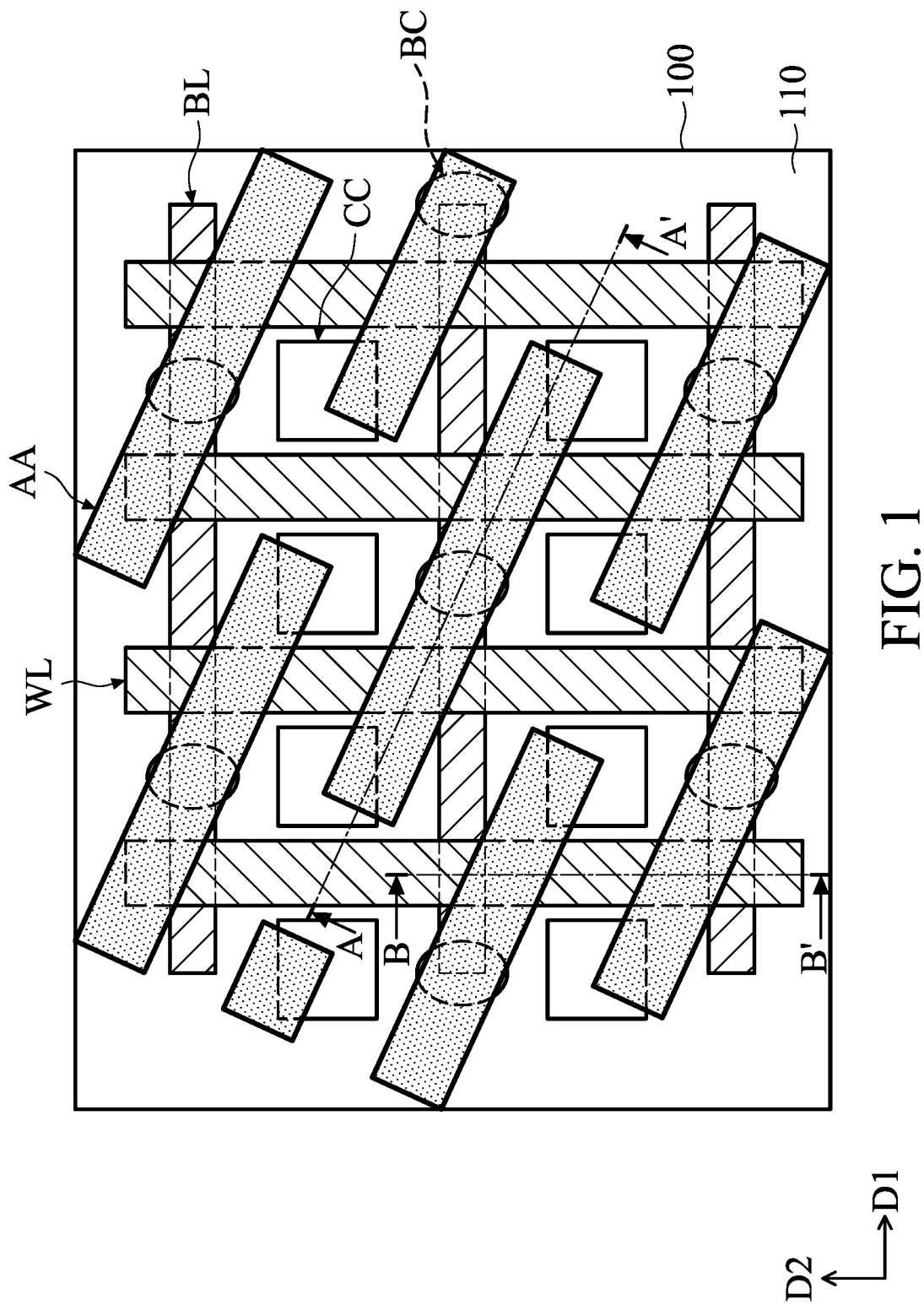
FIG. 1 is a schematic diagram of a circuit layout of a semiconductor structure according to some embodiments of the present disclosure.

FIG. 1 is a schematic diagram of a circuit layout of a semiconductor structure according to some embodiments of the present disclosure. The semiconductor structure includes a substrate 100, an isolation structure 110, an active area AA, a bit line BL, a word line WL, a storage node contact CC and a bit line contact BC.

In some embodiments, a plurality of bit lines BL may be provided and disposed on the substrate 100. Each bit line BL extends along a first direction D1, and adjacent bit lines BL are arranged in a second direction D2 with an interval. A plurality of word lines WL may be provided and disposed in the substrate 100. Each word line WL extends along the second direction D2, and adjacent word lines WL are arranged in the first direction D1 with an interval. The word line WL may be a buried word line. For example, a gate structure of the word line WL may be lower than a top surface of the substrate 100.

In some embodiments, an isolation structure 110 may be formed in the substrate 100, so as to define the range of the active area AA by the isolation structure 110 and separate two adjacent active areas AA from each other. A plurality of active area AA may be provided and formed in the substrate 100. Each active area AA extends substantially along a direction having an angle with the first direction D1.

As shown in FIG. 1, each active area AA crosses two word lines WL and crosses one bit line BL. Each active area AA and the corresponding bit line BL have an overlapping area and non-overlapping areas located on both sides of the overlapping area. In each active area AA, there are storage node contacts CC in the aforementioned two non-overlapping areas.

In some embodiments, two storage node contacts CC corresponding to one active area AA are disposed on the outside of the two word lines WL passing through the active area AA, respectively. The storage node contact CC may be in contact with a capacitor, and thus the storage node contact CC may also be referred as a capacitor contact. The storage node contacts CC are disposed on the substrate 100, and each storage node contact CC is disposed between two adjacent bit lines BL and between two adjacent word lines WL.

In some embodiments, each active area AA has a bit line contact BC at the overlapping area with the corresponding bit line BL. When each bit line BL crosses the corresponding word line WL, the bit line contact BC may be used to electrically connect the corresponding doped region between the two word lines WL. The corresponding doped region may be, for example, a first doped region 101 shown in the subsequent FIG. 18.

As shown in FIG. 1, the semiconductor structure of the present disclosure may include memory cells arranged in a 3×2 array. One active word line and one passing word line may be respectively provided on both sides of one target word line of the semiconductor structure of the present disclosure.

Figure 10B:
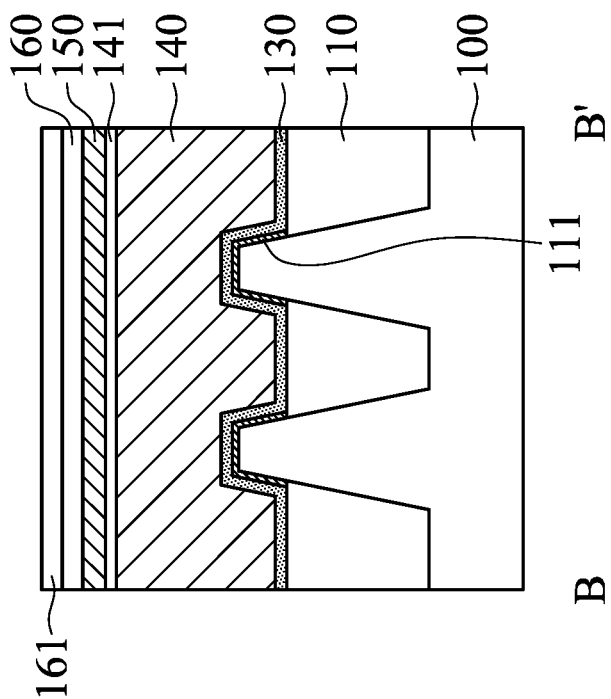
Figure 10A:
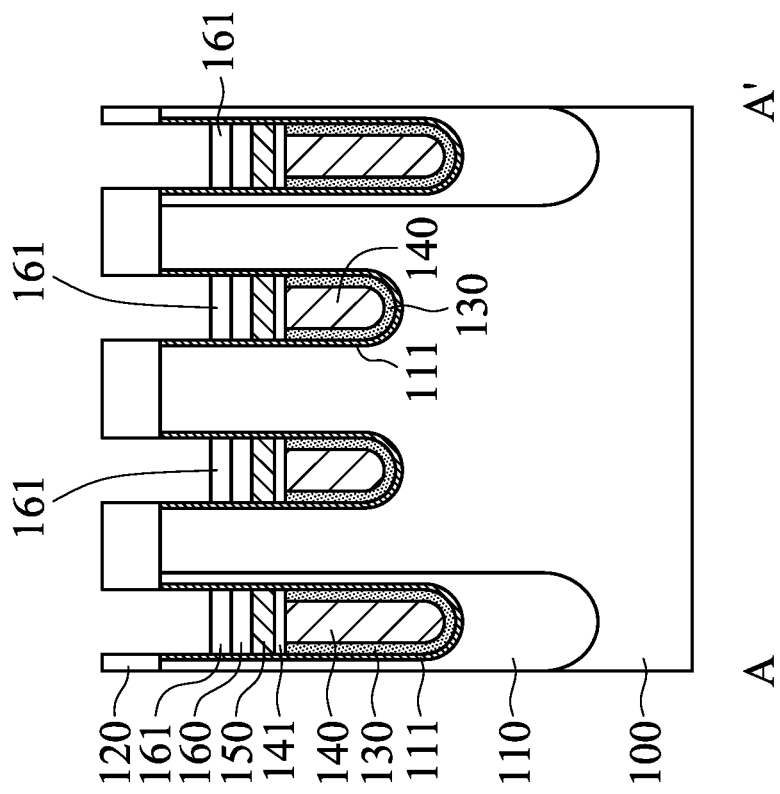
Figure 11B:
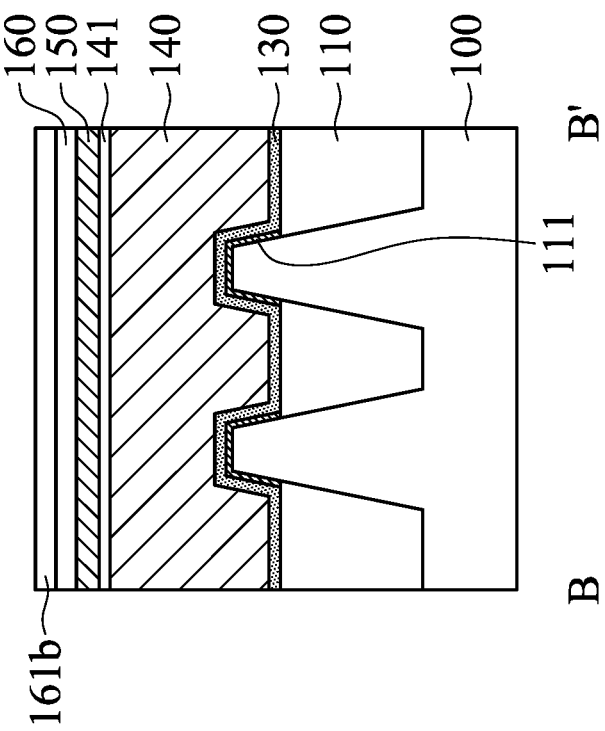
Figure 11A:
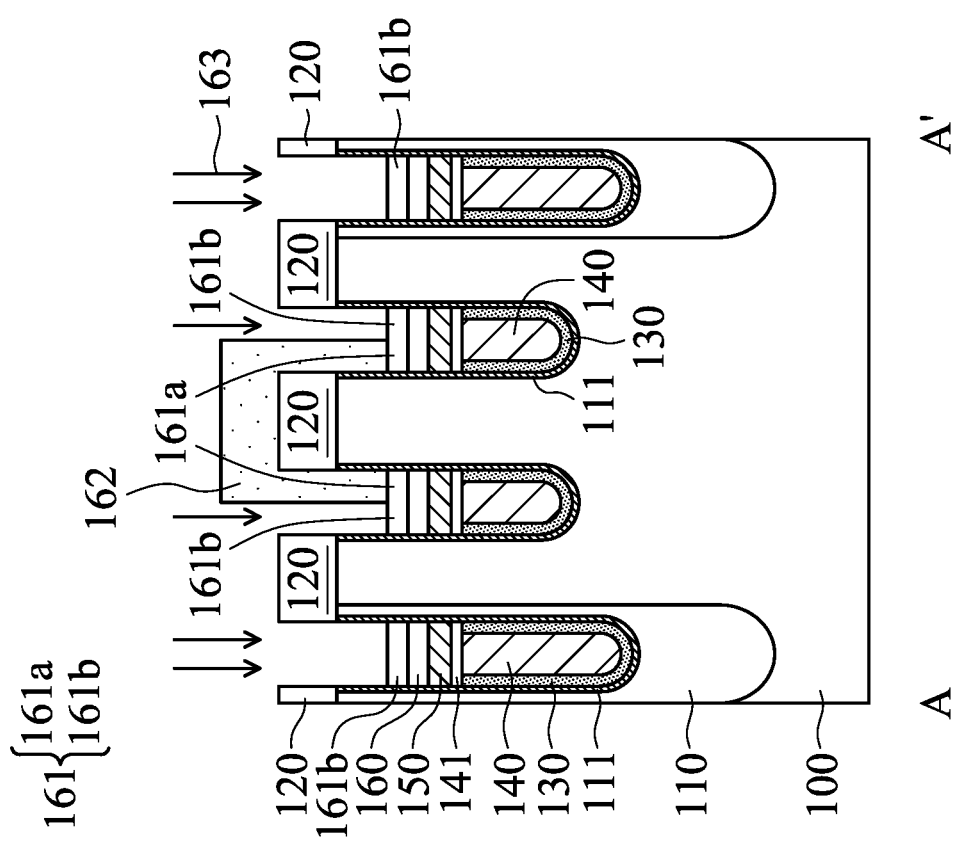
Figure 11C:
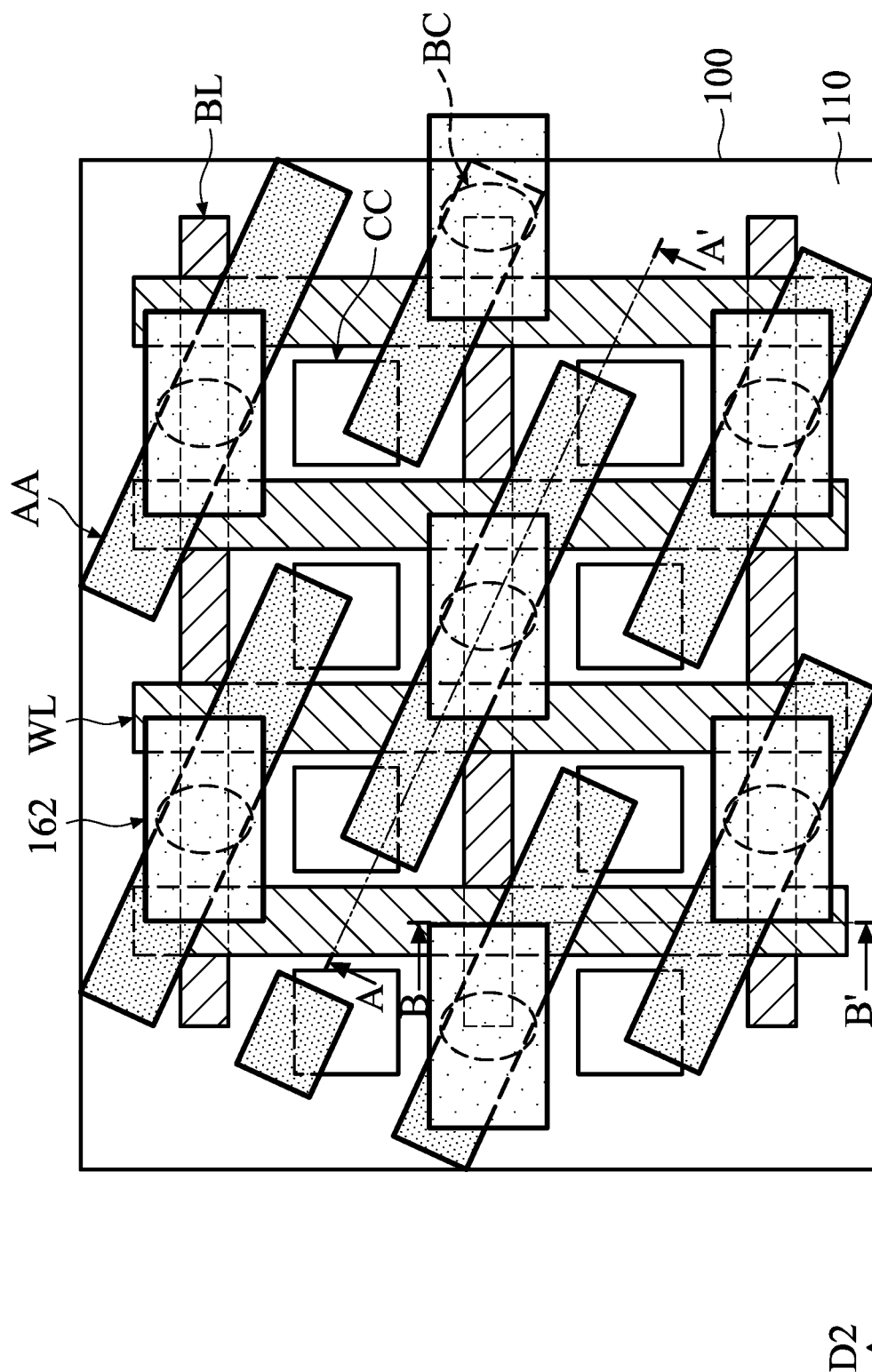
FIG. 11C is a schematic diagram of a circuit layout of a semiconductor structure according to some embodiments of the present disclosure.

FIGS. 2-8, 9A, 9B, 10A, 10B, 11A, 11B, 12A, 12B, 13A, 13B, 14A, 14B, 15A, 15B, 16A, 16B, 17A, 17B, and 18 are schematic cross-sectional views of a semiconductor structure 1 at various stages of formation and FIG. 11C is a schematic diagram of a circuit layout of the semiconductor structure, according to some embodiments of the present disclosure. Wherein, FIGS. 2-8, 9A, 10A, 11A, 12A, 13A, 14A, 15A, 16A, and 17A are schematic cross-sectional views taken along the line segment AA' shown in FIG. 1. FIGS. 9B, 10B, 11B, 12B, 13B, 14B, 15B, 16B and 17B are schematic cross-sectional views taken along the line segment BB' shown in FIG. 1.

Referring to FIG. 2, in some embodiments, a substrate 100 is provided, and an isolation structure 110 is formed in the substrate 100.

Referring to FIG. 3, a patterned etching mask 120 is formed on the substrate 100. Referring to FIG. 4, an etching process is then performed to form a first trench 121 in the substrate 100 and between the isolation structures 110, and to form a second trench 122 in the isolation structure 110. In some embodiments, the first trench 121 is used for accommodating the subsequently formed active word line, and the second trench 122 is used for accommodating the subsequently formed passing word line. Since the etching selectivity of the substrate 100 and the etching selectivity of the isolation structure 110 are different, the first trench 121 and the second trench 122 have different depths. For example, the depth of the first trench 121 is smaller than the depth of the second trench 122.

Referring to FIG. 5, a gate dielectric layer 111 is formed in the first trench 121 and the second trench 122. In some embodiments, the gate dielectric layer 111 may include oxide, nitride, oxynitride, high dielectric constant (high-k) material, or a combination thereof.

Figure 6:
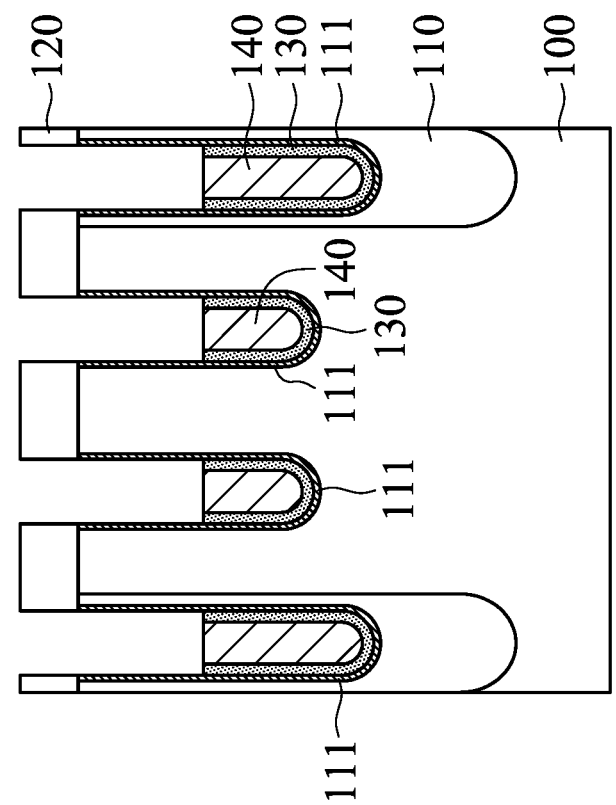

Referring to FIG. 6, a first liner 130 is conformally formed on the gate dielectric layer 111 in the first trench and the second trench. In some embodiments, the first liner 130 is formed along the top and side surfaces of the etching mask 120 and the surface of the gate dielectric layer 111. In some embodiments, the first liner 130 may be titanium nitride (TiN), tungsten (W), or a combination thereof. The first liner 130 may be formed between the first trench 121 and the subsequently formed first conductive layer, and between the second trench 122 and the subsequently formed first conductive layer. Thus, the first liner 130 may be used as a buffer layer for reducing stress concentration, an adhesion layer for improving the adhesion force and/or a diffusion barrier layer, to improve the reliability of the subsequently formed semiconductor structure. In some embodiments, the first liner 130 may be omitted.

In some embodiments, a first conductive layer 140 is then formed on the first liner 130, and the first conductive layer 140 completely fills the first trench and the second trench as shown in FIG. 5. In some embodiments, the first conductive layer 140 may be tungsten. In some embodiments, the first liner 130 and the first conductive layer 140 are formed of the same material. For example, the first liner 130 and the first conductive layer 140 are formed of tungsten.

Figure 7:
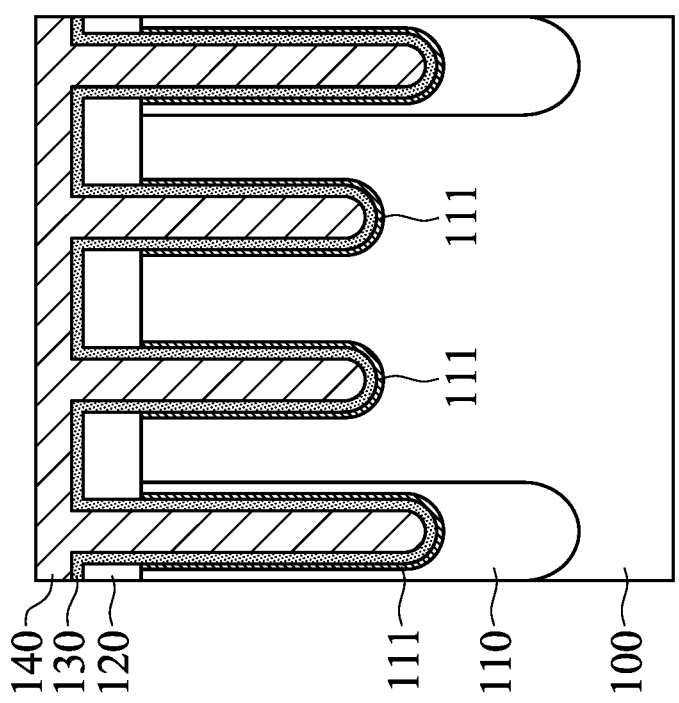

Referring to FIG. 7, the first conductive layer 140 and the first liner 130 are etched back, so that the top surfaces of the first conductive layer 140 and the first liner 130 are substantially coplanar. In some embodiments, the top surface of the first conductive layer 140 and the top surface of the first liner 130 are lower than the top surface of the substrate 100, to expose a portion of the side surface of the gate dielectric layer 111. In some embodiments, the depth of the etching back may be controlled by the parameters of the etching back process, thereby controlling the thickness of the first conductive layer 140.

Figure 8:
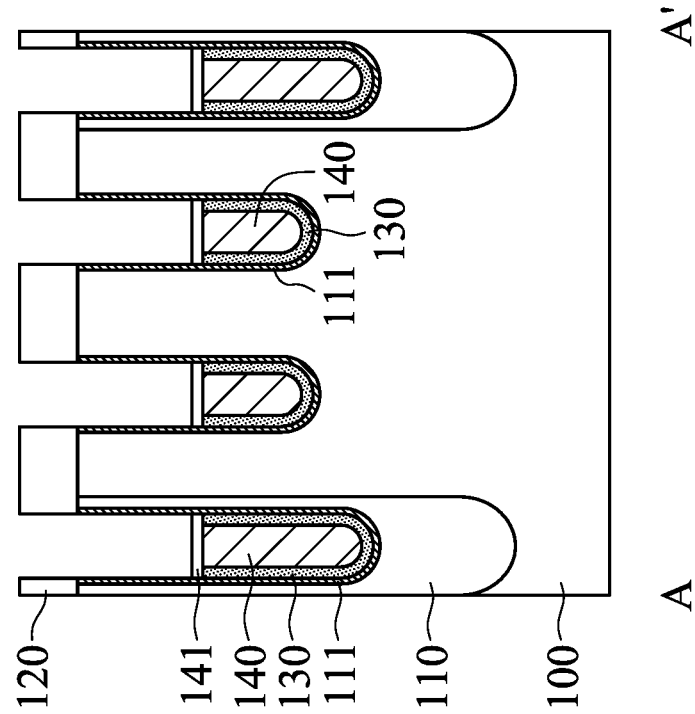

Referring to FIG. 8, a second liner 141 is formed on the first conductive layer 140 and the first liner 130. The material and process used to form the second liner 141 may be the same or different from the material and process used to form the first liner 130. In some embodiments, the second liner 141 and the first liner 130 are both titanium nitride. The first liner 130 and the second liner 141 jointly surround the first conductive layer 140.

In some embodiments, the second liner 141 is disposed between the first conductive layer 140 and the subsequently formed second conductive layer, and the second liner 141 is also disposed between the first conductive layer 140 and the subsequently formed third conductive layer. In some embodiments, the second liner 141 is continuous and may be formed at the same time. In some embodiments, the top surface of the second liner 141 is substantially a flat surface. In some embodiments, the second liner 141 is used to improve the adhesion between the second conductive layer and/or the subsequently formed third conductive layer and the first conductive layer 140, so as to improve the reliability of the semiconductor structure. In some embodiments, the second liner 141 may be omitted.

Figure 9B:
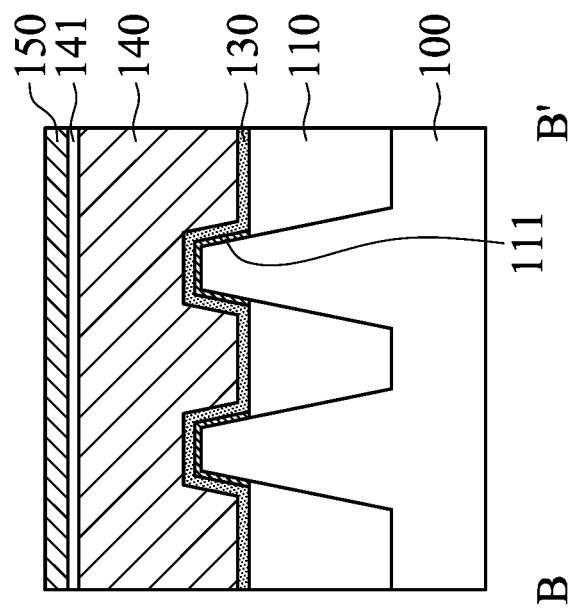
Figure 9A:
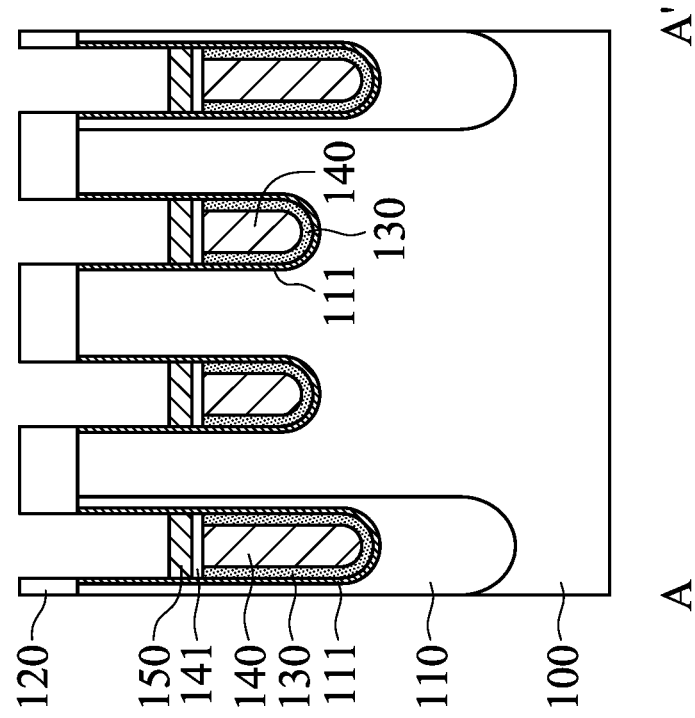

Referring to FIGS. 9A and 9B, a second conductive layer 150 is formed on the top surface of the first conductive layer 140. For example, the second conductive layer 150 is formed on the second liner 141. In some embodiments, the second conductive layer 150 may be polysilicon, such as undoped polysilicon, or boron (B)-doped polysilicon. In some embodiments, the second conductive layer 150 may be doped with different concentrations of dopants according to the electrical properties of the semiconductor structure.

Referring to FIGS. 10A and 10B, a first dielectric layer 160 is formed on the second conductive layer 150. The first dielectric layer 160 may include oxide, nitride, oxynitride, low dielectric constant (low-k) material, or a combination thereof. Next, a sacrificial layer 161 is formed on the first dielectric layer 160. The sacrificial layer 161 may be polysilicon. In some embodiments, the second conductive layer 150, the first dielectric layer 160, and the sacrificial layer 161 may be formed by a deposition process followed by an etching back process. In some embodiments, the top surfaces of the second conductive layer 150, the first dielectric layer 160, and the sacrificial layer 161 are substantially flat surfaces.

Referring to FIGS. 11A to 11C, a photoresist pattern 162 is formed on the sacrificial layer 161 to cover a portion of the sacrificial layer 161. As shown in FIGS. 11A and 11B, the photoresist pattern 162 covers a first portion 161a of the sacrificial layer 161 and expose a second portion 161b of the sacrificial layer 161.

In some embodiments, the photoresist pattern 162 covers the first portion 161a of the sacrificial layer 161, a portion of the sidewall of the gate dielectric layer 111, and the sidewall and top surface of the etching mask 120 between adjacent first trenches. In other embodiments, the photoresist pattern 162 covers the first portion 161a of the sacrificial layer 161, a portion of the gate dielectric layer 111, and the sidewalls of the etching mask 120 between adjacent first trenches, but the photoresist pattern 162 does not cover the top surface of the etching mask 120.

In some embodiments, the isolation structures 110 separate two first trenches 121 in pairs and from other pairs of first trenches. That is, one active area includes a pair of first trenches. Therefore, the first portions 161a are provided as a pair, and the first portions 161a are located in the pair of the first trenches, respectively. In some embodiments, the first portion 161a is away from the isolation structure 110 and the first portion 161a is adjacent to the substrate 100 which is between the pair of first trenches. In some embodiments, the sacrificial layer 161 in the first trench includes the first portion 161a of the sacrificial layer 161 and the second portion 161b of the sacrificial layer 161. However, the sacrificial layer 161 in the second trench is totally the second portion 161b of the sacrificial layer 161.

FIG. 11C is a schematic diagram of a circuit layout of a semiconductor structure, according to some embodiments. It should be particularly noted that although the bit line BL, bit line contact BC, word line WL, and storage node contact CC have not been formed in this process stage, they has been already shown in FIG. 11C for ease of explaining the relative relationship of them. As shown in FIG. 11C, the photoresist pattern 162 covers a portion of the adjacent word line WL which is subsequently formed, that is, as shown in FIG. 11A, the photoresist pattern 162 covers a portion of the sacrificial layer 161. As shown in FIG. 11C, the photoresist pattern 162 covers the subsequently formed bit line contact BC, that is, as shown in FIG. 11A, the photoresist pattern 162 covers a portion of the substrate 100 between the pair of the first trenches.

Next, after the photoresist pattern 162 is formed on the sacrificial layer 161, an ion implantation process 163 is performed on the second portion 161b of the sacrificial layer 161 which is not covered by the photoresist pattern 162. The aforementioned ion implantation process may change the etching selectivity of the second portion 161b by doping dopants into the second portion 161b, so that the etching selectivity of the first portion 161a is greater than that of the second portion 161b. That is, for the same etchant, the etching rate of the first portion 161a is greater than the etching rate of the second portion 161b, so that the sacrificial layer 161 may be partially removed later.

Figures 12A, 12B:
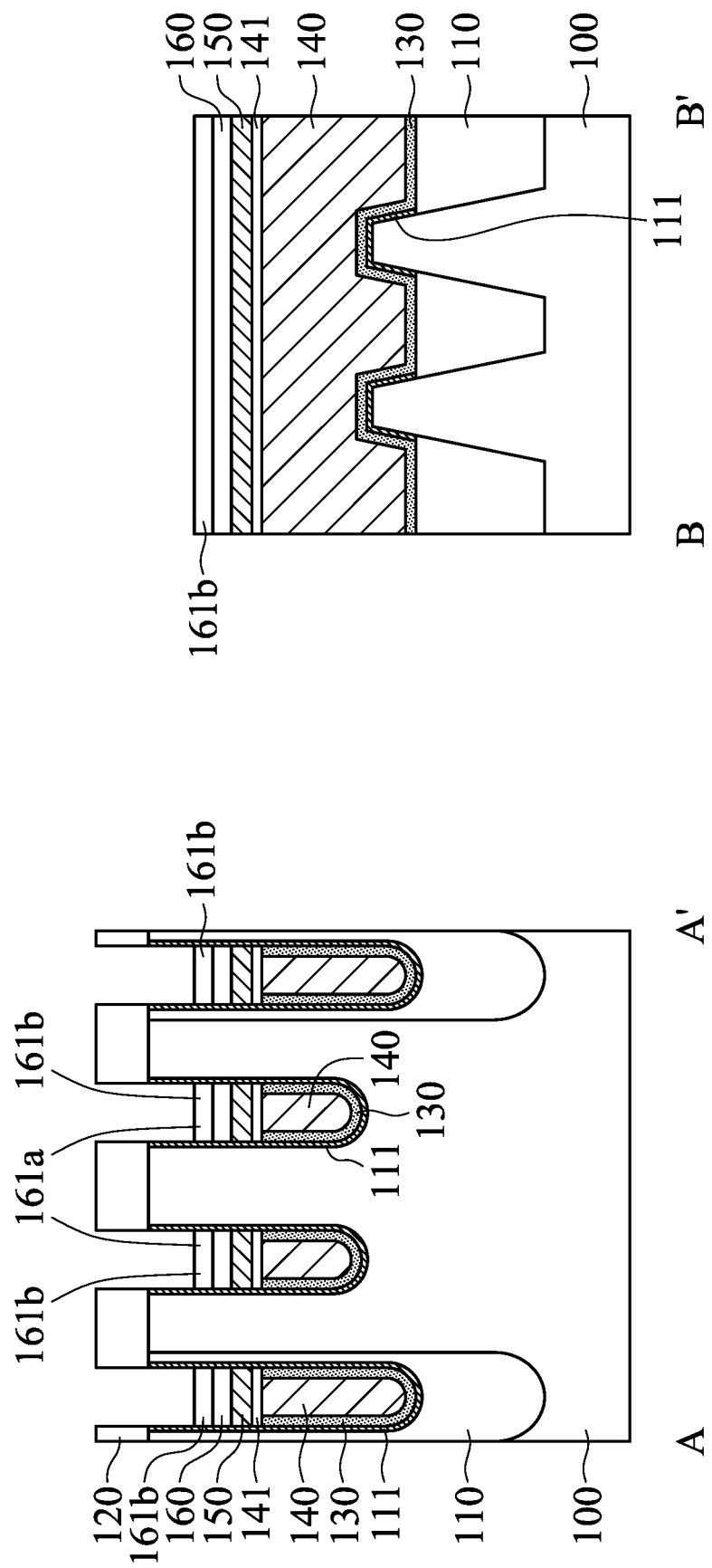

As shown in FIGS. 12A and 12B, after the implantation process 163 is performed, the photoresist pattern 162 is removed.

Figure 13B:
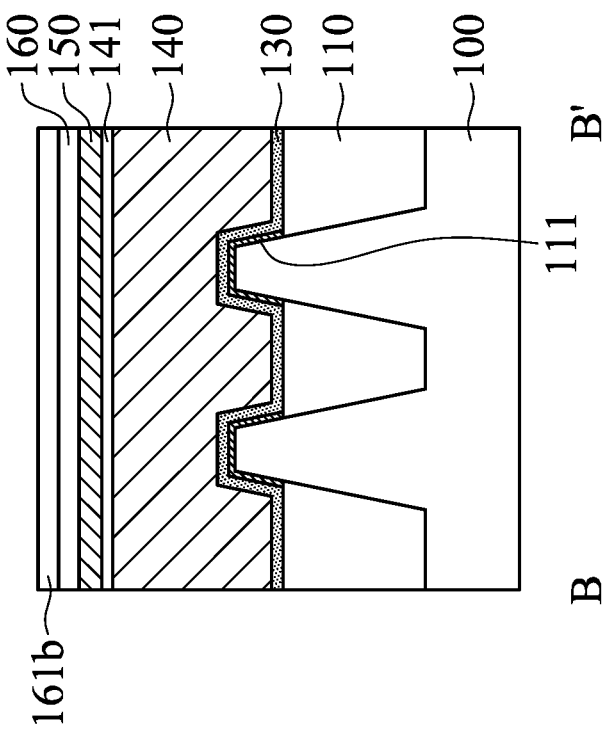
Figure 13A:
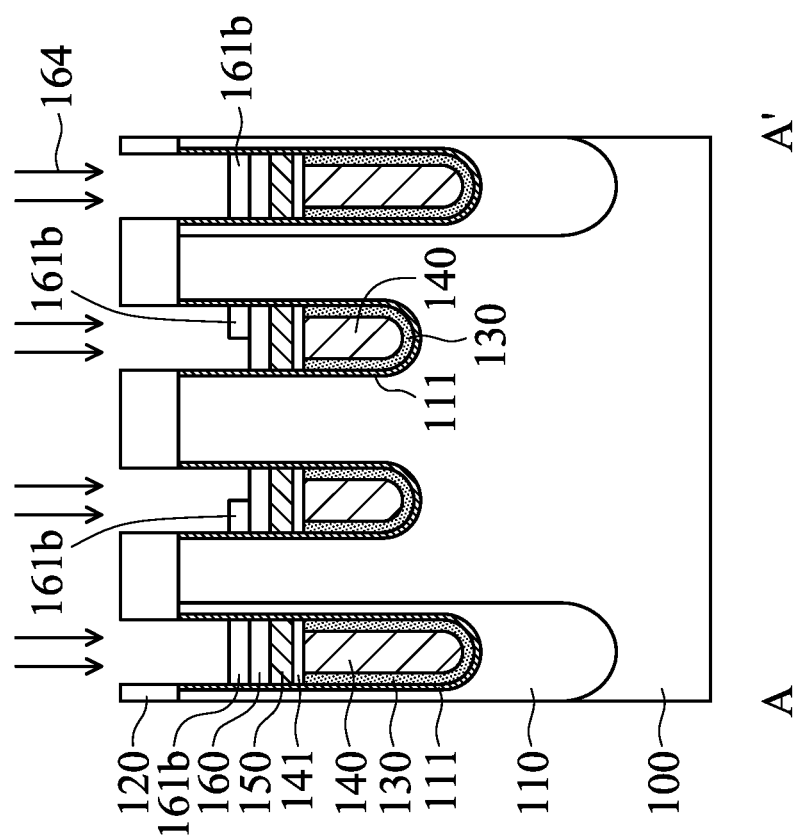

As shown in FIGS. 13A and 13B, the first portion 161a of the sacrificial layer 161 is removed by a wet etching process. In some embodiments, since the sacrificial layer 161 in the second trench belongs to the second portion 161b, the sacrificial layer 161 in the second trench does not be removed.

In some embodiments, after the removal of the first portion 161a of the sacrificial layer 161, an etching process 164 is performer with the second portion 161b of the sacrificial layer 161 remained on the first dielectric layer 160 as an etching mask. In some embodiments, during the etching process 164, the etching process 164 first removes a portion of the first dielectric layer 160 exposed by the second portion 161b. Then, since etching selectivities of the materials of the second portion 161b of the sacrificial layer 161 and the second conductive layer 150 are the same, a portion of the second conductive layer 150 and the second portion 161b of the sacrificial layer 161 are removed at the same time, until a portion of the second liner 141 is exposed.

That is, after the aforementioned implantation process 163, the etching selectivity of the second portion 161b of the sacrificial layer 161 is substantially the same as the etching selectivity of the second conductive layer 150. Therefore, when the same etchant is used, the etching rates of the second portion 161b of the sacrificial layer 161 and the second conductive layer 150 are substantially the same. In some embodiments, the materials of the second portion 161b of the sacrificial layer 161 and the second conductive layer 150 are both boron-doped polysilicon. In some embodiments, the thickness of the sacrificial layer 161 and the second conductive layer 150 are substantially the same, so that after the etching process 164, the second portion 161b of the sacrificial layer 161 is completely removed and a portion of the second liner 141 is exposed.

In another embodiment, the material of the second portion 161b of the sacrificial layer 161 is similar to but not the same as the material of the second conductive layer 150. For example, the second portion 161b of the sacrificial layer 161 may be boron-doped polysilicon, and the material of the second conductive layer 150 may be undoped polysilicon. However, it is possible to further adjust the thickness of the sacrificial layer 161 and the second conductive layer 150 to achieve the effect of completely removing the second portion 161b of the sacrificial layer 161 and exposing a portion of the second liner 141 at the same time.

In yet another embodiment, photoresist pattern 162 shown in FIG. 11A may cover the second portion 161b of the sacrificial layer 161 and expose the first portion 161a of the sacrificial layer 161. The first portion 161a of the sacrificial layer 161 is doped by the implantation process 163, such that the etching selectivity of the first portion 161a of the sacrificial layer 161 is greater than that of the second portion 161b of the sacrificial layer 161. Then, the first portion 161a of the sacrificial layer 161 is removed by the etching process.

In some embodiments, after the etching process 164, the second conductive layer 150 is etched, and a portion of the second conductive layer 150 and a portion of the first dielectric layer 160 are exposed. That is, the side surfaces of the second conductive layer 150 and the first dielectric layer 160 are exposed. In some embodiments, the second liner 141 and the first liner 130 may be omitted at the same time. In the embodiment where the second liner 141 is omitted, after the etching process 164, a portion of the first conductive layer 140 is exposed.

Figure 14B:
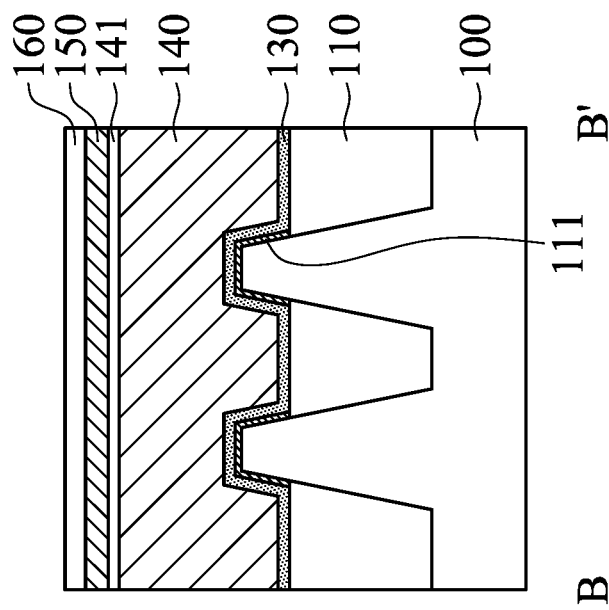
Figure 14A:
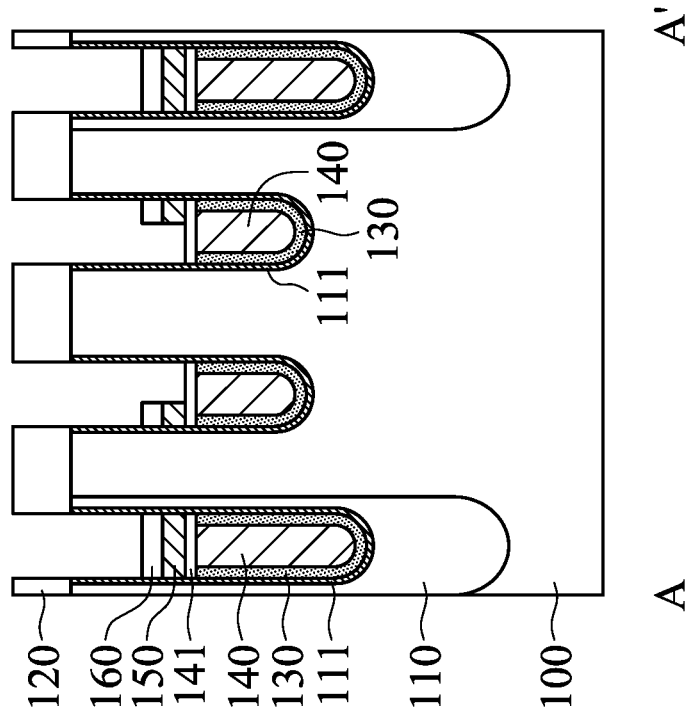

As shown in FIGS. 14A and 14B, the second portion 161b of the sacrificial layer 161 is removed, and a portion of the second liner 141 in the first trench is exposed. In some embodiments, a top surface of the first dielectric layer 160 in the first trench is exposed and a top surface of the first dielectric layer 160 in the second trench is also exposed.

Figure 15B:
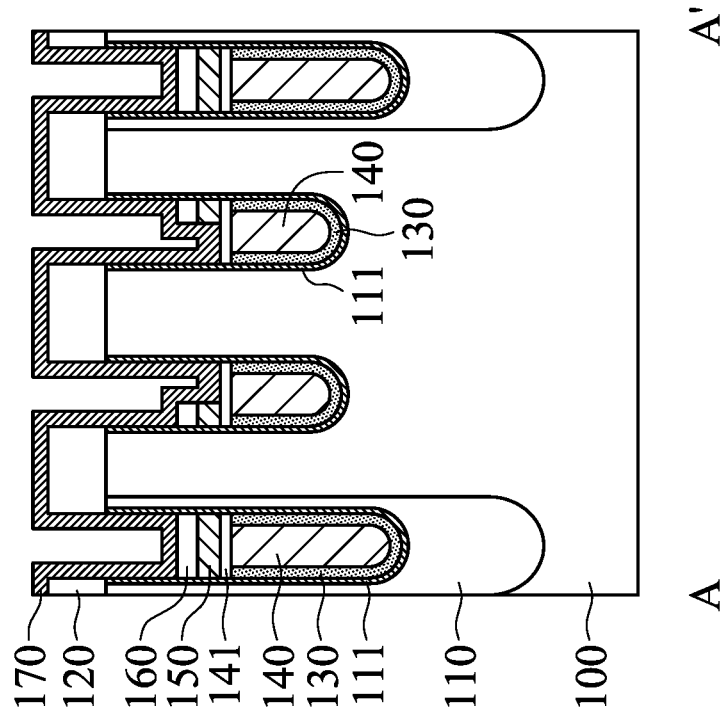
Figure 15A:
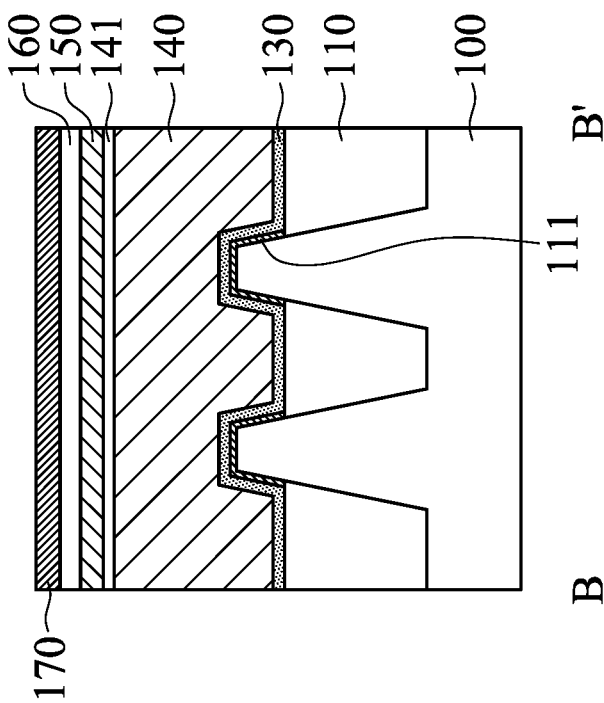

As shown in FIGS. 15A and 15B, a third conductive layer 170 is conformally formed on the first conductive layer 140. For example, the third conductive layer 170 extends along the top and side surfaces of the etching mask 120, the side surface of the gate dielectric layer 111, the top and side surfaces of the first dielectric layer 160, and the side surface of the second conductive layer 150 and the top surface of the second liner 141. In some embodiments, the thickness of the third conductive layer 170 may be adjusted depending on the desired thickness of the etched-back third conductive layer 170. In some embodiments, the material and process for forming the third conductive layer 170 may be the same as or different from the material and process for forming the first conductive layer 140 and/or the second conductive layer 150.

As shown in FIGS. 16A and 16B, the third conductive layer 170 is etched back, and the third conductive layer 170 is disposed on a portion of the exposed second liner 141 to cover the second liner 141. Therefore, the thickness of the third conductive layer 170 may be controlled by the parameters of the etching back process. In some embodiments, a pair of third conductive layers 170 is respectively disposed in two adjacent first trenches. The third conductive layer 170 is far away from the isolation structure 110 and is adjacent to the substrate 100, wherein the substrate 100 is between the two adjacent first trenches. In some embodiments, the third conductive layer 170 is symmetrically disposed.

In some embodiments, the third conductive layer 170 and the second conductive layer 150 are on the top surface of the first conductive layer 140, and the third conductive layer 170 and the second conductive layer 150 are electrically connected with each other. In some embodiments, the third conductive layer 170 is in direct contact with the second conductive layer 150. In some embodiments, the bottom surfaces of the second conductive layer 150 and the third conductive layer 170 are in contact with the top surface of the second liner 141, and the top surface of the first conductive layer 140 is in contact with the bottom surface of the second liner 141. In some embodiments, the second liner 141 is omitted, and the first conductive layer 140, the second conductive layer 150, and the third conductive layer 170 are in contact with each other.

In some embodiments, the bottom surfaces of the second conductive layer 150 and the third conductive layer 170 are substantially coplanar. In some embodiments, a stack including the second conductive layer 150 and the first dielectric layer 160 is formed on the first conductive layer 140, and the stack has a pattern corresponding to the second portion 161b of the sacrificial layer 161 in the first trench.

In some embodiments, the second conductive layer 150 and the third conductive layer 170 are respectively in contact with opposite sidewalls of the first trench. For example, the second conductive layer 150 contacts one sidewall of the first trench, and the third conductive layer 170 contacts the other sidewall opposite to the sidewall.

In some embodiments, the first conductive layer 140 has a first thickness T1. The second conductive layer 150 has a second thickness T2. The third conductive layer 170 has a third thickness T3. In some embodiments, the ratio (T1/T2) of the first thickness T1 of the first conductive layer 140 to the second thickness T2 of the second conductive layer 150 is 1.67 to 10. When the ratio of the first thickness T1 of the first conductive layer 140 to the second thickness T2 of the second conductive layer 150 is larger than 10, the reduction of the gate induced drain leakage current (GIDL) is not as expected. When the ratio of the first thickness T1 of the first conductive layer 140 to the second thickness T2 of the second conductive layer 150 is less than 1.67, because the total thickness of the first thickness T1 and the second thickness T2 is limited, the problem of high resistance of the word line WL is occurred. Wherein the limited total thickness and small ratio represents that the first thickness T1 is smaller.

In some embodiments, the ratio (T2/T3) of the second thickness T2 of the second conductive layer 150 to the third thickness T3 of the third conductive layer 170 is 0.5 to 2. When the ratio of the second thickness T2 of the second conductive layer 150 to the third thickness T3 of the third conductive layer 170 is greater than 2, the effect of increasing the saturation current is not as expected. When the ratio of the second thickness T2 of the second conductive layer 150 to the third thickness T3 of the third conductive layer 170 is less than 0.5, the leakage current of the bit line BL increases.

The details of the positions of the first conductive layer 140, the second conductive layer 150, and the third conductive layer 170 having different work functions will be described below.

Figure 17B:
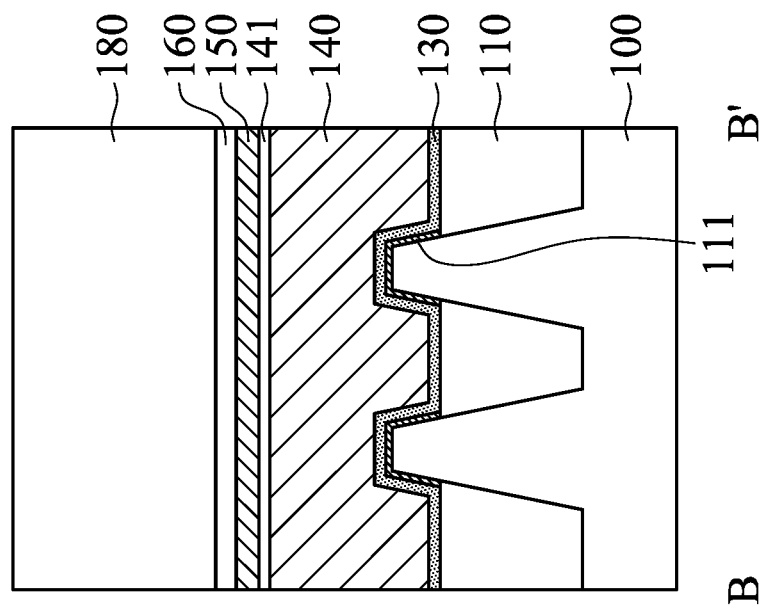
Figure 17A:
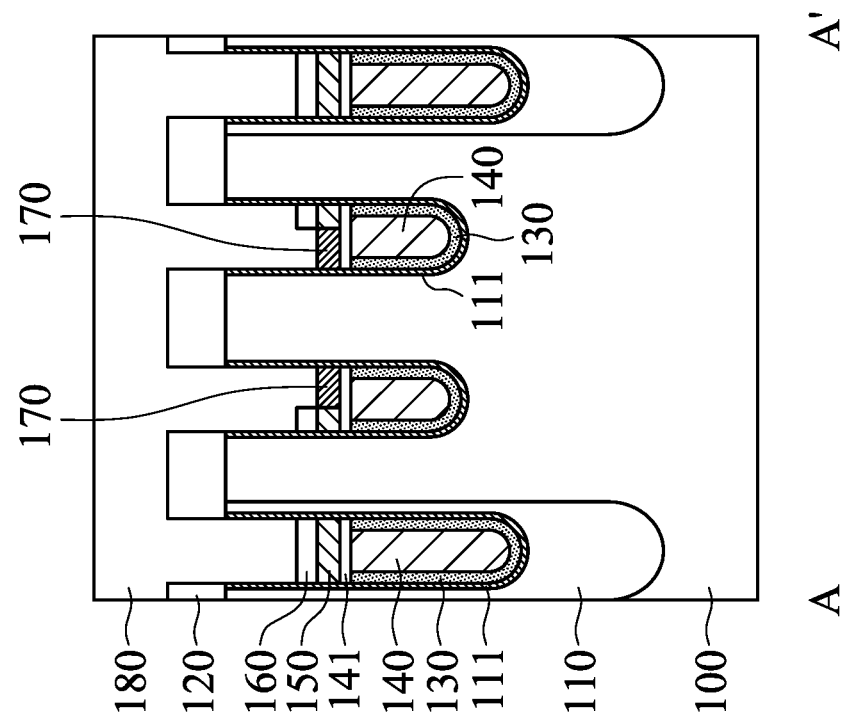

Referring to FIGS. 17A and 17B, schematic cross-sectional views of a semiconductor structure in which the top surface of the second conductive layer 150 and the top surface of the third conductive layer 170 are substantially coplanar are exemplarily shown. In some embodiments, the second dielectric layer 180 is formed on the first dielectric layer 160 and the third conductive layer 170. In some embodiments, the material and process of the second dielectric layer 180 may be the same or different from the material and process of the first dielectric layer 160.

Figures 18, 19:
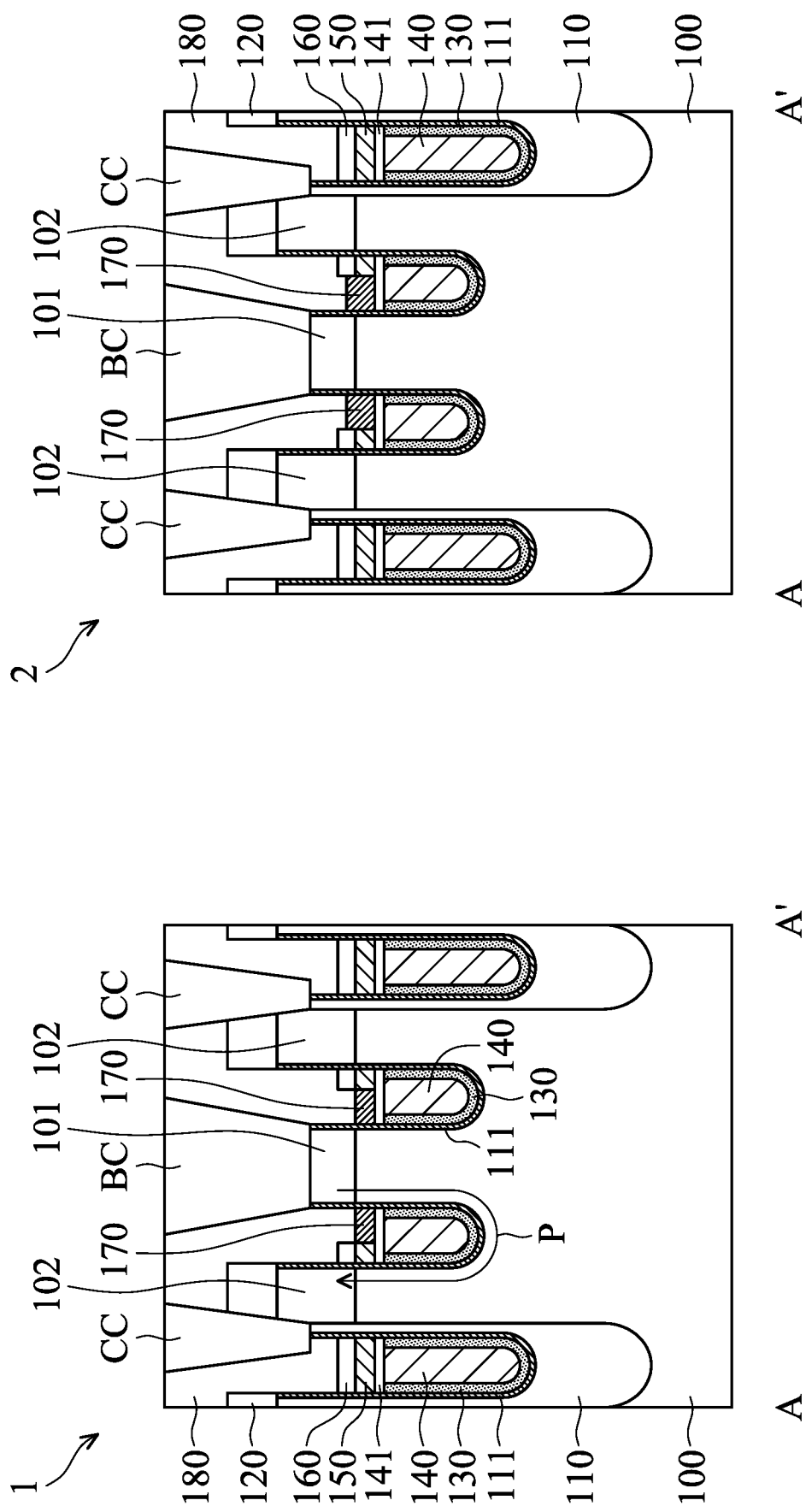

Referring to FIG. 18, a bit line contact BC is formed between the pair of third conductive layers 170 by an etching process and a deposition process. That is, the bit line contact BC is formed in the substrate 100 and between the first trenches. Furthermore, a further process may be performed to form the bit line BL as shown in FIG. 1. Next, a storage node contact CC is formed in the substrate 100 and between the first trench and the adjacent second trench to obtain the semiconductor structure 1 of the present disclosure.

In some embodiments, in one active area AA, the first conductive layer 140, the second conductive layer 150, and the third conductive layer 170 in the first trench collectively serve as the gate electrode of the active word line in the word line WL as shown in FIG. 1. The first conductive layer 140, the second conductive layer 150, and the third conductive layer 170 in the isolation structure 110 collectively serve as the gate electrode of the passing word line in the word line WL as shown in FIG. 1.

In some embodiments, a planarization process may be performed before forming the bit line contact BC to remove the etching mask 120 and expose the top surface of the substrate 100. In other embodiments, the planarization process may not be performed. For example, the etching mask 120 is remained on the substrate 100, and the bit line contact BC and/or the storage node contact CC passing through the etching mask 120 are formed.

In some embodiments, after the formation of the bit line contact BC and the storage node contact CC, a first doped region 101 and a second doped region 102 are formed in the substrate 100 by an implantation process. In some embodiments, the first doped region 101 and the second doped region 102 are disposed on opposite sides of the first conductive layer 140. In some embodiments, the first doped region 101 and/or the second doped region 102 are doped by P-type or N-type dopants according to requirements. In some embodiments, before forming the bit line contact BC and the storage node contact CC, such as when the substrate 100 is provided, the first doped region 101 and the second doped region 102 are formed in the substrate 100 by an implantation process. In some embodiments, one of the first doped region 101 and the second doped region 102 serves as a source region, and the other of the first doped region 101 and the second doped region 102 serves as a drain region. That is, either the first doped region 101 or the second doped region 102 serve as a source region, and the second doped region 102 or the first doped region 101 serves as a drain region.

For convenience of explanation, the first doped region 101 serves as the source region, the second doped region 102 serves as the drain region, and the first conductive layer 140, the second conductive layer 150 and the third conductive layer 170 in the first trench all serve as the buried gate structure of the word line WL, as shown in FIG. 1 and described below.

In the semiconductor structure of the present disclosure, the current path P starts from the first doped region 101 as the source region, follows the outer profile of the first trench, and enters the second doped region 102 as the drain region. Specifically, the current path P starts from the first doped region 101, sequentially approaches profiles of the second dielectric layer 180, the third conductive layer 170, the first conductive layer 140, the second conductive layer 150, the first dielectric layer 160, the second dielectric layer 180, and enters the second doped region 102.

In some embodiments, the work function of the third conductive layer 170 is greater than the work function of the second conductive layer 150. For example, the work function of the third conductive layer 170 is greater than the work function of the second conductive layer 150 by a difference of 0.3 to 0.9. Compared with the second conductive layer 150, the third conductive layer 170 is closer to the bit line contact BC, so the conduction current close to the bit line contact BC may be increased. In this embodiment, the work function affects the conductive properties at the interface, for example, the interface between a metal and a semiconductor. Thus, the second conductive layer 150 with a smaller work function may inhibit electrons from flowing to the second conductive layer 150, thereby increasing the conduction current through the third conductive layer 170. In addition, since the work function of the second conductive layer 150 close to the storage node contact CC is smaller than the work function of the third conductive layer 170, the leakage current of the storage node contact CC may be reduced. For example, the GIDL generated close to the second conductive layer 150 is reduced.

In some embodiments, the work function of the first conductive layer 140 is greater than the work function of the second conductive layer 150. For example, the work function of the first conductive layer 140 is greater than the work function of the second conductive layer 150 by a difference of 0.3 to 0.7. Compared with the second conductive layer 150 having a smaller work function, the first conductive layer 140 having a greater work function is located deeper in the first trench, so the first conductive layer 140 may be far away from the second doped region 102 that serves as a drain region. In other words, the first conductive layer 140 having the greater work function is far away from the top surface of the substrate 100, thereby reducing the leakage current close to the second doped region 102. In this embodiment, since the work function affects the conductive properties of the GIDL at an interface, for example, the interface between a metal and a semiconductor, the second conductive layer 150 having a smaller work function may inhibit electrons from flowing to the second conductive layer 150 thereby reducing the GIDL.

In other embodiments, except that the work function of the first conductive layer 140 is greater than the work function of the second conductive layer 150, the work function of the third conductive layer 170 is greater than the work function of the first conductive layer 140. For example, The work function of the first conductive layer 140 is greater than the work function of the third conductive layer 170 by a difference of 0.1 to 0.4. Therefore, the saturation current may be increased without affecting the leakage current of the second doped region 102.

According to the above embodiments, for example, the work function of titanium nitride is approximately 4.7, the work function of tungsten is approximately 4.52, the work function of tungsten nitride (WN) is approximately 4.6, and the work function of polysilicon is approximately 4.05. Therefore, in some embodiments, the first liner 130 may be titanium nitride, the first conductive layer 140 may be tungsten, the second liner 141 may be titanium nitride, and the second conductive layer 150 may be doped or undoped polysilicon, and the third conductive layer 170 may be titanium nitride. In some other embodiments, the first liner 130 may be titanium nitride, the first conductive layer 140 may be tungsten, the second liner 141 may be titanium nitride, the second conductive layer 150 may be doped or undoped polysilicon, and the third conductive layer 170 may be tungsten.

In other embodiments, the materials of the second conductive layer 150 and the third conductive layer 170 may be selected, such that the conductivity of the second conductive layer 150 is smaller than the conductivity of the third conductive layer 170. In this embodiment, the materials may be further selected, such that the conductivities of the third conductive layer 170 and the first conductive layer 140 are greater than that of the second conductive layer 150, to increase the on-state current and reduce the leakage current. In other embodiments, the conductivity of the first conductive layer 140 may be greater than the conductivity of the third conductive layer 170.

In other embodiments, the first doped region 101 serves as the drain region, and the second doped region 102 serves as the source region, and similarly, the leakage current close to the storage node contact CC may be reduced, and the conduction current close to the bit line contact BC may be increased.

In some embodiments, with a vertical line passing through the bit line contact BC and the first doped region 101 as the symmetry axis, the semiconductor structure 1 of the present disclosure may be referred to as a symmetric structure. In some embodiments, with a boundary line passing through the boundary of the second conductive layer 150 and the third conductive layer 170 as the symmetry axis, the semiconductor structure 1 of the present disclosure may be referred to as an asymmetric structure.

Referring to FIG. 19, it shows the semiconductor structure 2, wherein the top surface of the third conductive layer 170 is substantially higher than the second conductive layer 150. As shown in FIG. 19, in the embodiment where the top surface of the third conductive layer 170 is substantially higher than the second conductive layer 150, the total length of the current path P is longer, and the channel length is increased accordingly, thereby obtaining a greater saturation current. In other words, the third thickness T3 of the third conductive layer 170 after performing the etching back process may be adjusted according to requirements, and the current path length of the semiconductor structure may be adjusted accordingly.

In summary, the semiconductor structure of the present disclosure includes the buried word line structure formed by the stack structure of the first conductive layer, the second conductive layer, and the third conductive layer. In addition, because the third conductive layer close to the bit line contact in the semiconductor structure has a greater work function, the on-state current may be increased. Moreover, because the second conductive layer away from the bit line contact in the semiconductor structure has a smaller work function, the leakage current may be decreased. For example, the gate induced drain leakage current may be reduced. Therefore, it is possible to provide a semiconductor structure and the method of forming the same that may overcome the contradiction between refreshing time and write recovery time, and may effectively increase the on-state current and reduce the leakage current.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for changing, substituting, replacing and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising
   a substrate;
   a trench disposed in the substrate;
   a gate dielectric layer disposed in the trench
   a first conductive layer disposed in the trench;
   a second conductive layer disposed on a top surface of the first conductive layer;
   a third conductive layer disposed on the top surface of the first conductive layer and electrically connected to the second conductive layer;
   a source region and a drain region disposed in the substrate and disposed on opposite sides of the first conductive layer, respectively;
   a bit line contact disposed on one of the source region and the drain region; and
   a storage node contact disposed on the other of the source region and the drain region,
   wherein the second conductive layer and the third conductive layer respectively contact opposite sidewalls of the trench opposite sidewalls of the gate dielectric layer.

2. The semiconductor structure as claimed in claim 1, wherein a work function of the first conductive layer and a work function of the third conductive layer are greater than a work function of the second conductive layer.

3. The semiconductor structure as claimed in claim 2, wherein the difference between the work functions of the first conductive layer and the second conductive layer is 0.3 to 0.7.

4. The semiconductor structure as claimed in claim 2, wherein the difference between the work functions of the third conductive layer and the second conductive layer is 0.3 to 0.9.

5. The semiconductor structure as claimed in claim 2, wherein the work function of the third conductive layer is greater than the work function of the first conductive layer.

6. The semiconductor structure as claimed in claim 5, wherein the difference between the work functions of the third conductive layer and the first conductive layer is 0.1 to 0.4.

7. The semiconductor structure as claimed in claim 1, wherein one of the second conductive layer and the third conductive layer having a greater work function is closer to the bit line contact than the other one of the second conductive layer and the third conductive layer.

8. The semiconductor structure as claimed in claim 1, wherein the second conductive layer is in contact with the third conductive layer.

9. The semiconductor structure as claimed in claim 1, wherein a ratio of a thickness of the first conductive layer to a thickness of the second conductive layer is 1.67 to 10.

10. The semiconductor structure as claimed in claim 1, wherein a ratio of a thickness of the second conductive layer to a thickness of the third conductive layer is 0.5 to 2.

11. The semiconductor structure as claimed in claim 1, wherein a top surface of the third conductive layer is level with or higher than the second conductive layer.

12. The semiconductor structure as claimed in claim 1, wherein a conductivity of the first conductive layer and a conductivity of the third conductive layer are greater than a conductivity of the second conductive layer.

13. The semiconductor structure as claimed in claim 1, wherein a conductivity of the first conductive layer is greater than a conductivity of the third conductive layer.

14. The semiconductor structure as claimed in claim 1, further comprising:
    a first liner disposed between the trench and the first conductive layer;
    a second liner disposed between the first conductive layer and the second conductive layer and between the first conductive layer and the third conductive layer;
    a first dielectric layer disposed on the second conductive layer; and
    a second dielectric layer disposed on the first dielectric layer and the third conductive layer.

15. The semiconductor structure as claimed in claim 14, wherein the first liner and the second liner surround the first conductive layer.

* * * * *